United States Patent
Weiss et al.

(10) Patent No.: US 11,567,664 B2
(45) Date of Patent: Jan. 31, 2023

(54) DISTRIBUTING DATA ACROSS A MIXED DATA STORAGE CENTER

(71) Applicant: International Business Machines Corporation, Armonk, NY (US)

(72) Inventors: Moshe Weiss, Tel Aviv (IL); Amir Epstein, Tel Aviv (IL); Danny Harnik, Tel Mond (IL); Vladimir Shalikashvili, Tel Aviv (IL); Ety Khaitzin, Holon (IL); Yoni Raveh, Modin (IL)

(73) Assignee: International Business Machines Corporation, Armonk, NY (US)

( * ) Notice: Subject to any disclaimer, the term of this patent is extended or adjusted under 35 U.S.C. 154(b) by 1058 days.

(21) Appl. No.: 15/954,461

(22) Filed: Apr. 16, 2018

(65) Prior Publication Data

US 2019/0317670 A1 Oct. 17, 2019

(51) Int. Cl.
*G06F 3/06* (2006.01)
*G06F 30/20* (2020.01)

(52) U.S. Cl.
CPC ............ *G06F 3/0608* (2013.01); *G06F 3/068* (2013.01); *G06F 3/0653* (2013.01); *G06F 30/20* (2020.01)

(58) Field of Classification Search
CPC ........ G06F 3/0608; G06F 30/20; G06F 3/068; G06F 3/0653; G06F 3/0649; G06F 3/0604; G06F 3/0685
See application file for complete search history.

(56) References Cited

U.S. PATENT DOCUMENTS

| | | | |
|---|---|---|---|
| 8,566,428 B2 | 10/2013 | Wee | |
| 9,141,288 B2 | 9/2015 | Vasavi et al. | |
| 9,513,835 B2 | 12/2016 | Alatorre et al. | |
| 2012/0109936 A1 | 5/2012 | Zhang et al. | |
| 2012/0131196 A1 | 5/2012 | Yamada | |
| 2014/0180664 A1* | 6/2014 | Kochunni | G06F 11/3442 703/21 |
| 2015/0010143 A1* | 1/2015 | Yang | H04L 9/3249 380/28 |
| 2016/0034201 A1 | 2/2016 | Chambliss et al. | |
| 2016/0269313 A1 | 9/2016 | Brooker et al. | |
| 2016/0283139 A1 | 9/2016 | Brooker et al. | |
| 2018/0074745 A1 | 3/2018 | Harnik et al. | |

OTHER PUBLICATIONS

Anonymous, "NIST Cloud Computing Program," NIST, Information Technology Laboratory, Nov. 13, 2013, pp. 1-2, retrieved from www.nist.gov/itl/cloud/.

(Continued)

*Primary Examiner* — Saif A Alhija
(74) *Attorney, Agent, or Firm* — Zilka-Kotab, P.C.

(57) ABSTRACT

A computer-implemented method according to one embodiment includes identifying a plurality of storage systems within a storage environment, determining characteristics of each of the plurality of storage systems, the characteristics including one or more data reduction techniques implemented by each of the plurality of storage systems, performing a plurality of storage simulations of one or more data volumes, utilizing the characteristics of each of the plurality of storage systems, and determining one of the plurality of storage systems to store the one or more data volumes, based on results of the plurality of storage simulations.

20 Claims, 7 Drawing Sheets

(56) References Cited

OTHER PUBLICATIONS

Mell et al., "The NIST Definition of Cloud Computing," Version 15, Dec. 7, 2009, pp. 1-2.
Mell et al., "The NIST Definition of Cloud Computing," Recommendations of the National Institute of Standards and Technology, NIST Special Publication 800-145, Sep. 2011, pp. 1-7.

* cited by examiner

DISTRIBUTING DATA ACROSS A MIXED DATA STORAGE CENTER

BACKGROUND

The present invention relates to data storage management, and more specifically, this invention relates to dynamically determining an optimal storage location for data, based on characteristics of various available data storage.

Large-scale data storage can be implemented utilizing storage centers that contain a plurality of storage devices. Current data placement techniques only address storage devices having a single shared storage type within a storage center. However, current data placement techniques are not operable with respect to storage devices within a storage center that have different storage types, and that implement different data reduction techniques.

SUMMARY

A computer-implemented method according to one embodiment includes identifying a plurality of storage systems within a storage environment, determining characteristics of each of the plurality of storage systems, the characteristics including one or more data reduction techniques implemented by each of the plurality of storage systems, performing a plurality of storage simulations of one or more data volumes, utilizing the characteristics of each of the plurality of storage systems, and determining one of the plurality of storage systems to store the one or more data volumes, based on results of the plurality of storage simulations.

According to another embodiment, a computer program product for distributing data across a mixed data storage center includes a computer readable storage medium that has program instructions embodied therewith, where the computer readable storage medium is not a transitory signal per se, and where the program instructions are executable by a processor to cause the processor to perform a method comprising identifying a plurality of storage systems within a storage environment, utilizing the processor, determining characteristics of each of the plurality of storage systems, utilizing the processor, the characteristics including one or more data reduction techniques implemented by each of the plurality of storage systems, performing, utilizing the processor, a plurality of storage simulations of one or more data volumes, utilizing the characteristics of each of the plurality of storage systems, and determining, utilizing the processor, one of the plurality of storage systems to store the one or more data volumes, based on results of the plurality of storage simulations.

A system according to another embodiment comprises a processor, and logic integrated with the processor, executable by the processor, or integrated with and executable by the processor, where the logic is configured to identify a plurality of storage systems within a storage environment, determine characteristics of each of the plurality of storage systems, the characteristics including one or more data reduction techniques implemented by each of the plurality of storage systems, perform a plurality of storage simulations of one or more data volumes, utilizing the characteristics of each of the plurality of storage systems; and determine one of the plurality of storage systems to store the one or more data volumes, based on results of the plurality of storage simulations.

Other aspects and embodiments of the present invention will become apparent from the following detailed description, which, when taken in conjunction with the drawings, illustrate by way of example the principles of the invention.

DETAILED DESCRIPTION

Figure 1:
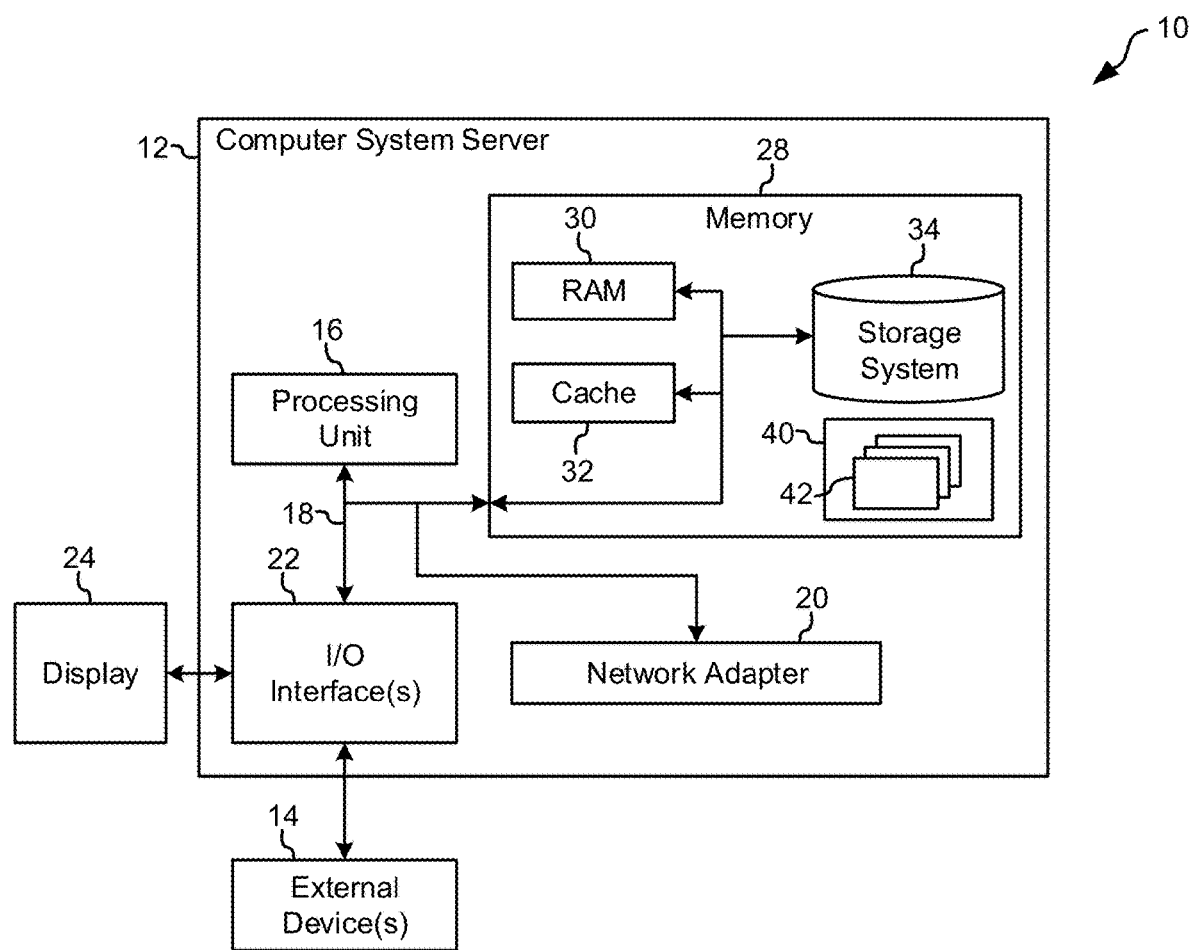
FIG. 1 depicts a cloud computing node according to an embodiment of the present invention.

The following description discloses several preferred embodiments of systems, methods and computer program products for distributing data across a mixed data storage center. Various embodiments provide a method for performing storage simulations using characteristics of storage systems as well as characteristics of data to be stored, and determining an optimal storage system to store data based on the simulations.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "includes" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for distributing data across a mixed data storage center.

In one general embodiment, a computer-implemented method includes identifying a plurality of storage systems within a storage environment, determining characteristics of each of the plurality of storage systems, the characteristics including one or more data reduction techniques implemented by each of the plurality of storage systems, performing a plurality of storage simulations of one or more data volumes, utilizing the characteristics of each of the plurality of storage systems, and determining one of the plurality of storage systems to store the one or more data volumes, based on results of the plurality of storage simulations.

In another general embodiment, a computer program product for distributing data across a mixed data storage center includes a computer readable storage medium that has program instructions embodied therewith, where the computer readable storage medium is not a transitory signal per se, and where the program instructions are executable by a processor to cause the processor to perform a method comprising identifying a plurality of storage systems within a storage environment, utilizing the processor, determining characteristics of each of the plurality of storage systems, utilizing the processor, the characteristics including one or more data reduction techniques implemented by each of the plurality of storage systems, performing, utilizing the processor, a plurality of storage simulations of one or more data volumes, utilizing the characteristics of each of the plurality of storage systems, and determining, utilizing the processor, one of the plurality of storage systems to store the one or more data volumes, based on results of the plurality of storage simulations.

In another general embodiment, a system comprises a processor, and logic integrated with the processor, executable by the processor, or integrated with and executable by the processor, where the logic is configured to identify a plurality of storage systems within a storage environment, determine characteristics of each of the plurality of storage systems, the characteristics including one or more data reduction techniques implemented by each of the plurality of storage systems, perform a plurality of storage simulations of one or more data volumes, utilizing the characteristics of each of the plurality of storage systems; and determine one of the plurality of storage systems to store the one or more data volumes, based on results of the plurality of storage simulations.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
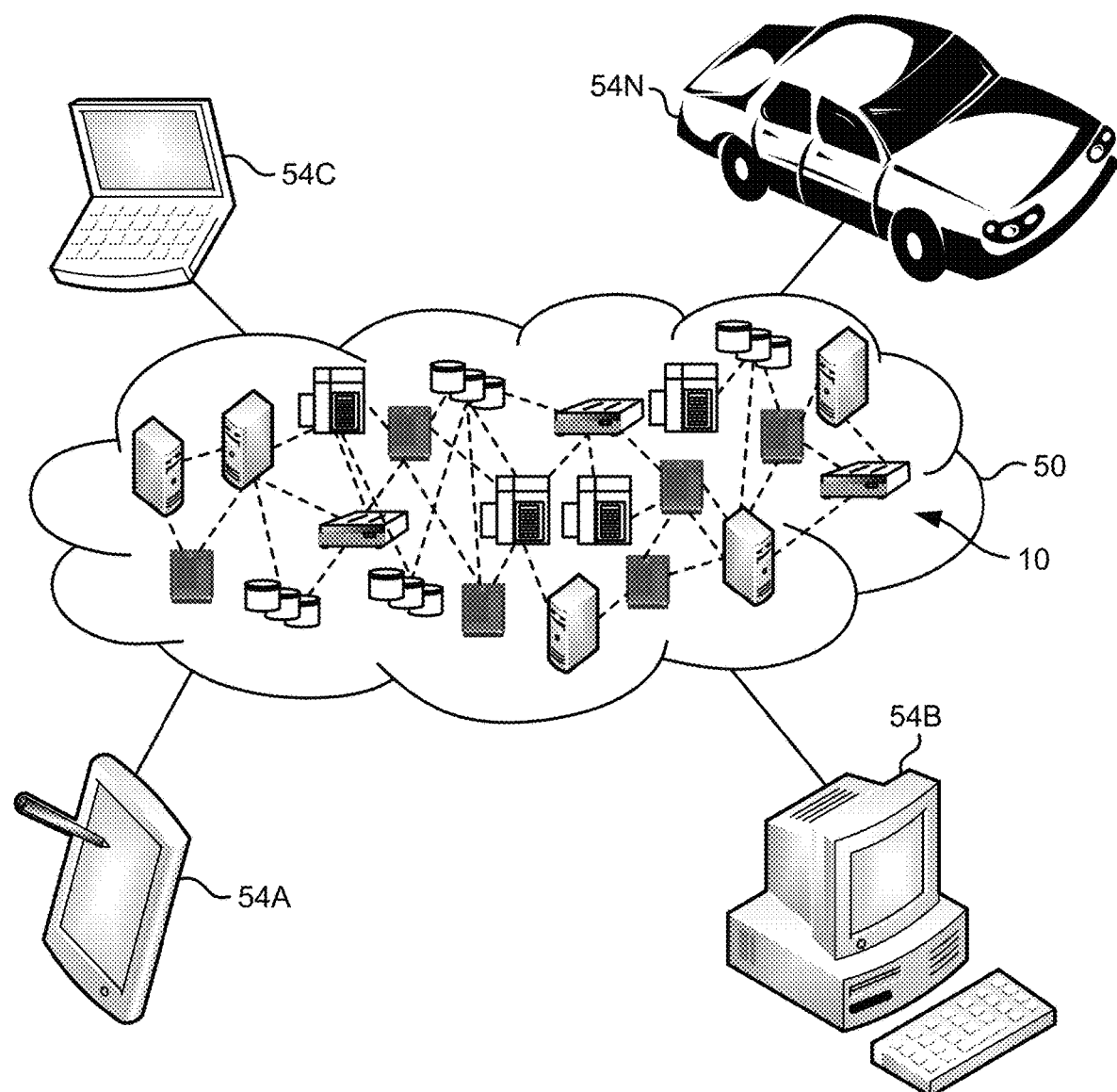
FIG. 2 depicts a cloud computing environment according to an embodiment of the present invention.

Referring now to FIG. 2, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
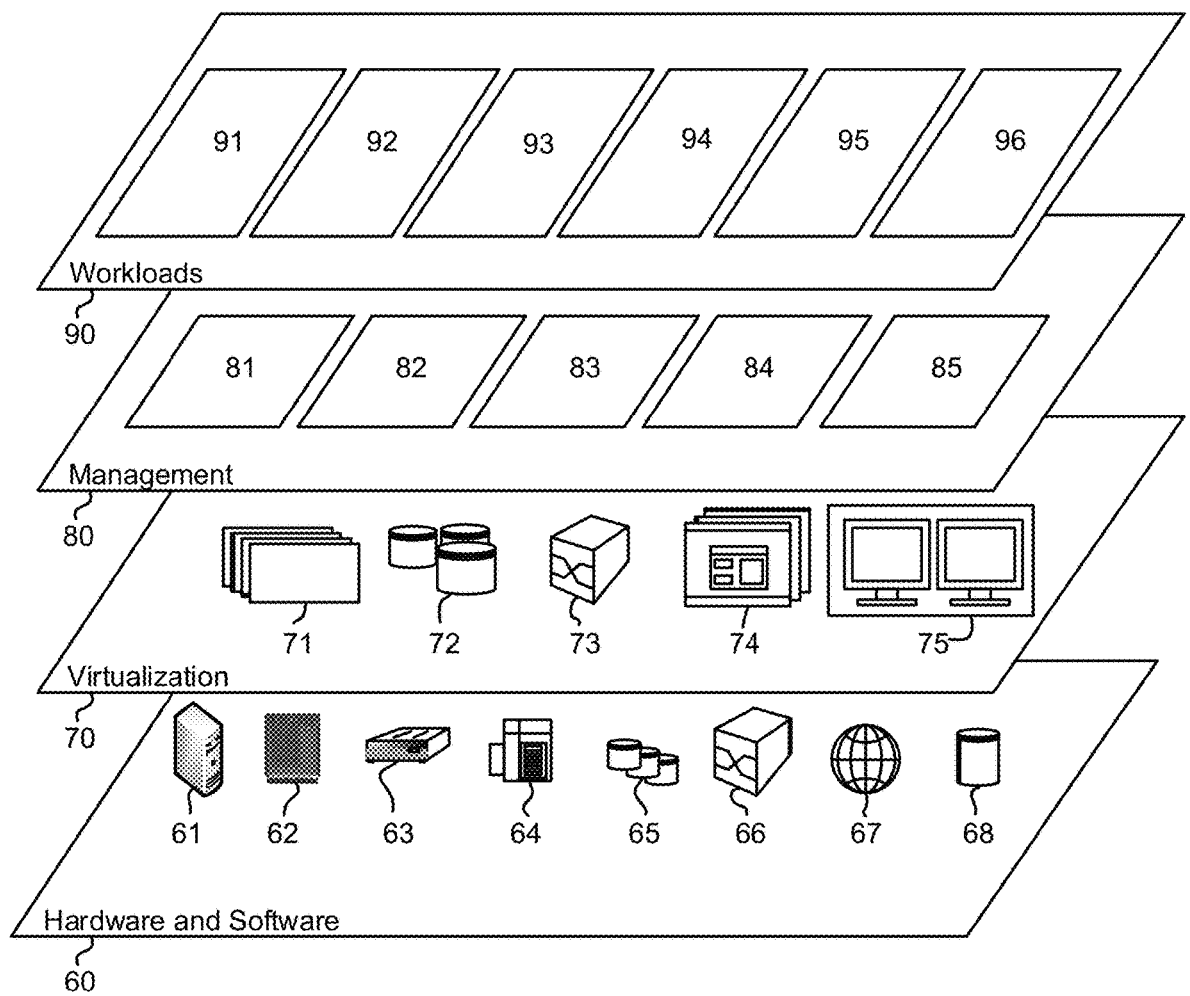
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and data storage and management 96.

Figure 4:
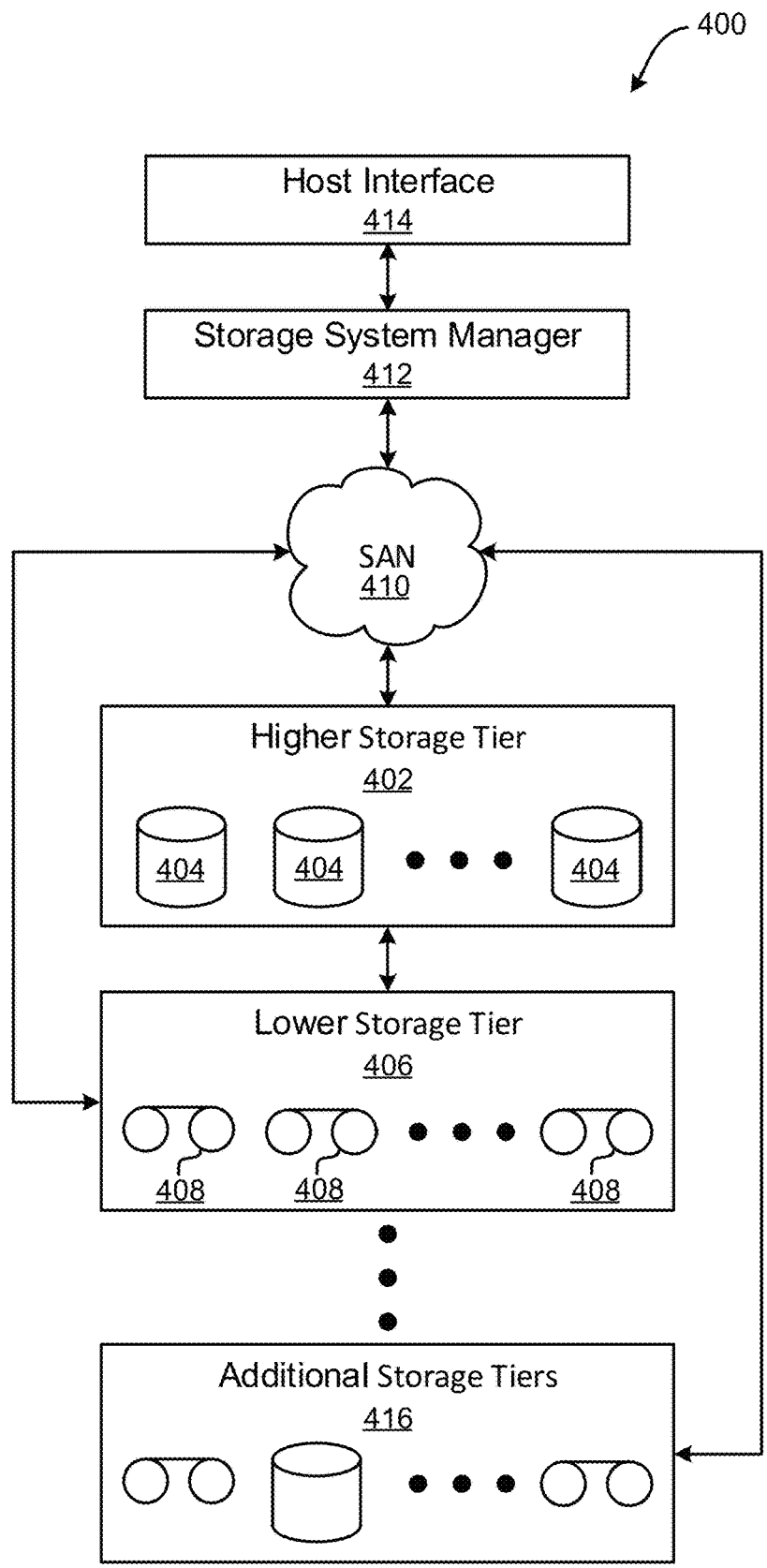
FIG. 4 illustrates a tiered data storage system in accordance with one embodiment.

Now referring to FIG. 4, a storage system 400 is shown according to one embodiment. Note that some of the elements shown in FIG. 4 may be implemented as hardware and/or software, according to various embodiments. The storage system 400 may include a storage system manager 412 for communicating with a plurality of media on at least one higher storage tier 402 and at least one lower storage tier 406. The higher storage tier(s) 402 preferably may include one or more random access and/or direct access media 404, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 406 may preferably include one or more lower performing storage media 408, including sequential access media such as magnetic tape in tape drives and/or optical media, slower accessing HDDs, slower accessing SSDs, etc., and/or others noted herein or known in the art. One or more additional storage tiers 416 may include any combination of storage memory media as desired by a designer of the system 400. Also, any of the higher storage tiers 402 and/or the lower storage tiers 406 may include some combination of storage devices and/or storage media.

The storage system manager 412 may communicate with the storage media 404, 408 on the higher storage tier(s) 402 and lower storage tier(s) 406 through a network 410, such as a storage area network (SAN), as shown in FIG. 4, or some other suitable network type. The storage system manager 412 may also communicate with one or more host systems (not shown) through a host interface 414, which may or may not be a part of the storage system manager 412. The storage system manager 412 and/or any other component of the storage system 400 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 400 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 402, may include a majority of SSD storage media for storing data in a higher performing storage environment, and remaining storage tiers, including lower storage tier 406 and additional storage tiers 416 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 402, while data not having one of these attributes may be stored to the additional storage tiers 416, including lower storage tier 406. Of course, one of skill in the art, upon reading the present descriptions, may devise many other combinations of storage media types to implement into different storage schemes, according to the embodiments presented herein.

According to some embodiments, the storage system (such as 400) may include logic configured to receive a request to open a data set, logic configured to determine if the requested data set is stored to a lower storage tier 406 of a tiered data storage system 400 in multiple associated portions, logic configured to move each associated portion of the requested data set to a higher storage tier 402 of the tiered data storage system 400, and logic configured to assemble the requested data set on the higher storage tier 402 of the tiered data storage system 400 from the associated portions.

Of course, this logic may be implemented as a method on any device and/or system or as a computer program product, according to various embodiments.

Figure 5:
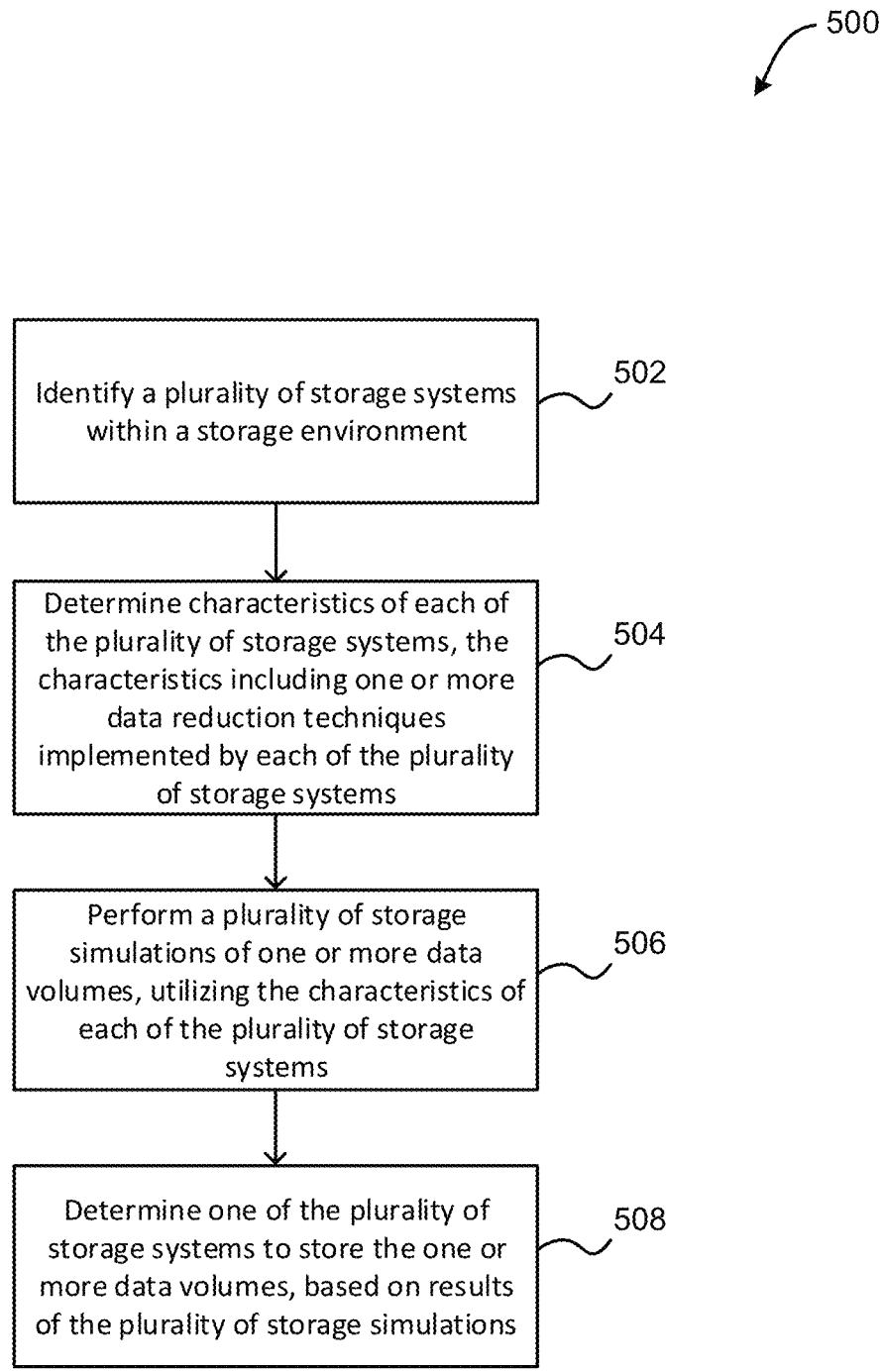
FIG. 5 illustrates a flowchart of a method for distributing data across a mixed data storage center, in accordance with one embodiment.

Now referring to FIG. 5, a flowchart of a method 500 is shown according to one embodiment. The method 500 may be performed in accordance with the present invention in any of the environments depicted in FIGS. 1-4 and 7, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 5, method 500 may initiate with operation 502, where a plurality of storage systems are identified within a storage environment. In one embodiment, each of the plurality of storage systems may include a system on which data is stored. In another embodiment, the plurality of storage systems may each include a storage type, such as software defined storage (SDS), disk-based storage (e.g., storage containing one or more hard disk drives, etc.), flash-based storage (e.g., storage containing one or more flash memory drives, etc.), etc.

Additionally, in one embodiment, the plurality of storage systems may each include a storage pool or storage tier within the storage environment. In another embodiment, the plurality of storage systems may include all storage systems currently running within the storage environment. In yet another embodiment, each of the plurality of storage systems may have a storage type that is different from other storage systems in the plurality of storage systems. In still another embodiment, the storage environment may include a cloud computing environment.

Further, method 500 may proceed with operation 504, where characteristics of each of the plurality of storage systems are determined, the characteristics including one or more data reduction techniques implemented by each of the plurality of storage systems. In one embodiment, the one or more data reduction techniques may include a type of data compression implemented by the storage system. For example, the data compression may include one or more lossless data compression methods. In another example, the data compression may include conversion of stored data into one or more predetermined formats.

Further still, in one embodiment, the one or more data reduction techniques may include a type of data deduplication implemented by the storage system. For example, the data deduplication may include one or more methods for identifying and eliminating duplicate copies of repeating data within one or more data volumes. In another example, the data deduplication may include the removal of duplicate data, and the storage of one or more pointers to data instead of the removed data.

In another embodiment, each of the plurality of storage systems may have characteristics that are different from other storage systems in the plurality of storage systems.

Also, in one embodiment, the one or more data reduction techniques implemented by a storage system may be stored as metadata in association with the storage system (e.g., as a profile of the storage system, etc.). In another embodiment, the characteristics may also include historical performance statistics for each of the plurality of storage systems. For example, the performance statistics may include input/output measurements per second (IOPS), data throughput, cache hit percentage, cache usage, input/output (I/O) locality information, etc. In another example, the performance statistics may include historical measurements, estimated or assigned values, etc. In yet another example, the historical performance statistics may obtained via systems monitoring and may be stored as metadata in association with the storage system.

In addition, in one embodiment, the characteristics may include one or more profiles for each of the plurality of storage systems. For example, the one or more profiles for a storage system may include one or more of a cost associated with data volume storage within the storage system, a maximum storage capacity of the storage system, a maximum IOPS capacity of the storage system, data mirroring capabilities of the storage system (e.g., the creation and maintenance of redundant copies of data within the storage system, etc.), one or more planned data evacuations involving the storage system, etc. In another example, the profiles may be stored as metadata in association with the storage system. In another embodiment, the characteristics may also include an amount and/or type of data currently being stored within each of the plurality of storage systems.

Furthermore, method 500 may proceed with operation 506, where a plurality of storage simulations of one or more data volumes are performed, utilizing the characteristics of each of the plurality of storage systems. In one embodiment, the one or more data volumes may include data to be stored within the storage environment. For example, the one or more data volumes may be received by the storage environment for storage in the storage environment. In yet another embodiment, the one or more data volumes may include data associated with one or more applications to be run.

Further still, in one embodiment, the plurality of storage simulations may also utilize characteristics of the one or more data volumes to be stored. In another embodiment, the characteristics of the one or more data volumes to be stored may include a profile for each data volume. For example, the profile may include a performance requirement for the data volume (e.g., the data volume requires a storage solution having a predetermined level of performance, etc.). In another example, the profile may include a capacity growth requirement for the data volume (e.g., the data volume requires a storage solution having a predetermined amount of free capacity, etc.).

Also, in one example, the profile may include a cost requirement for the data volume (e.g., the data volume requires a storage solution having a predetermined cost, etc.). In another example, the profile may include a timeline and/or lifecycle for the data volume (e.g., the data volume may need to be deleted after a predetermined time period, etc.). In yet another example, the profile may include one or more required storage characteristics for the data volume (e.g., the data volume may need to be stored within a system having data mirroring capabilities, etc.).

Additionally, in one embodiment, the characteristics of the one or more data volumes to be stored may include a compressibility of the data, deduplication-related characteristics of the data, etc. In another embodiment, each of the plurality of storage simulations may simulate the storage of the one or more data volumes in a different storage system of the plurality of storage systems. In yet another embodiment, one or more of the plurality of storage simulations may simulate the storage of the one or more data volumes in a subset of the plurality of storage systems.

Further, in one embodiment, each of the storage simulations may consider additional data volumes already stored within the plurality of storage systems. For example, these additional volumes may affect the amount of data reduction performed by the storage systems. In another embodiment, each data storage simulation may cover one or more predetermined time periods. For example, each data storage simulation may cover an initial short-term time period, a longer long-term time period, etc.

Further still, method 500 may proceed with operation 508, where one of the plurality of storage systems is determined to store the one or more data volumes, based on results of the plurality of storage simulations. In one embodiment, the results of the plurality of the storage simulations may include a plurality of different factors. In another embodiment, one factor may include a capacity usage of the one or more of the plurality of storage systems selected to store the one or more data volumes in the simulation. For example, the results of a simulation involving the storage of the one or more data volumes on a single selected storage system may include an amount of storage capacity of the storage system that is used by the one or more data volumes.

Also, in one embodiment, another factor may include an amount of data reduction performed by the one or more of the plurality of storage systems selected to store the one or more data volumes in the simulation. For example, the results of a simulation involving the storage of the one or more data volumes on a single selected storage system may include an amount of data reduction that is achieved by the storage system during the storage of the one or more data volumes. In another example, the amount of data reduction may consider the additional volumes already stored within the single selected storage system.

In addition, in one embodiment, another factor may include a total cost of using the one or more of the plurality of storage systems selected to store the one or more data volumes in the simulation. For example, the results of a simulation involving the storage of the one or more data volumes on a single selected storage system may include a monetary cost incurred by utilizing the storage system to store the one or more data volumes. In another embodiment, another factor may include a performance of the one or more of the plurality of storage systems selected to store the one or more data volumes in the simulation. For example, the results of a simulation involving the storage of the one or more data volumes on a single selected storage system may include a performance (e.g., IOPS, throughput, cache usage, etc.) of the storage system used to store the one or more data volumes.

Furthermore, in one embodiment, another factor may include a cost of a data migration to the one or more of the plurality of storage systems selected to store the one or more data volumes in the simulation. For example, the results of a simulation involving the storage of the one or more data volumes on a single selected storage system may include a cost (e.g., a monetary cost, a resource usage cost, etc.) of migrating the data volumes to the storage system used to store the one or more data volumes.

Further still, in one embodiment, the results may be averaged over an entire time period of the simulation. In another embodiment, maximum and minimum values for the each of the factors may also be recorded over the entire time period of the simulation. In yet another embodiment, determining one of the plurality of storage systems to store the one or more data volumes may include assigning a score to each of the plurality of storage simulations, based on the results.

Also, in one embodiment, the score may be assigned to each factor of the results. For example, a lower capacity usage by the storage system in the simulation may result in a higher score assigned to the corresponding factor. In another example, a larger amount of data reduction performed by the storage system in the simulation may result in a higher score assigned to the corresponding factor. In yet another example, a lower monetary cost incurred by the storage system in the simulation may result in a higher score assigned to the corresponding factor. In still another example, a higher performance of the storage system in the simulation may result in a higher score assigned to the corresponding factor. In another example, a lower cost of migrating the data volumes to the storage system in the simulation may result in a higher score assigned to the corresponding factor.

Additionally, in one embodiment, a weight may be applied to one or more scores (e.g., based on or more user preferences associated with the corresponding factor). In another embodiment, a total score may be determined for each simulation, based on the scores for each factor within the simulation. For example, the scores for each factor may be combined, averaged, etc.

Further, in one embodiment, determining one of the plurality of storage systems to store the one or more data volumes may include selecting a storage system from the one of the plurality of storage systems with the highest score. In another embodiment, the storage system determined to store the one or more data volumes may be identified to a user (e.g., displayed to the user, recommended to the user, etc.). In yet another embodiment, the data volumes may be automatically transferred to the storage system determined to store the one or more data volumes. For example, migration of the data volumes to the storage system may be automatically initiated in response to the determination.

Further still, in one embodiment, the plurality of storage volumes may be ranked, based on their assigned score. For example, the ranking may be presented to a user, in addition to one or more of the specific factors.

In this way, an optimal storage system may be selected to store the one or more data volumes, utilizing a dynamic analysis that considers space requirements of specific data on each of the plurality of storage systems, as well as data reduction capabilities of each of the plurality of storage systems, given specific data currently stored within each of the storage systems. The selection may also account for costs associated not only with the storage of the data within the storage systems, but also costs associated with migrating the data to and from the storage systems.

Figure 6:
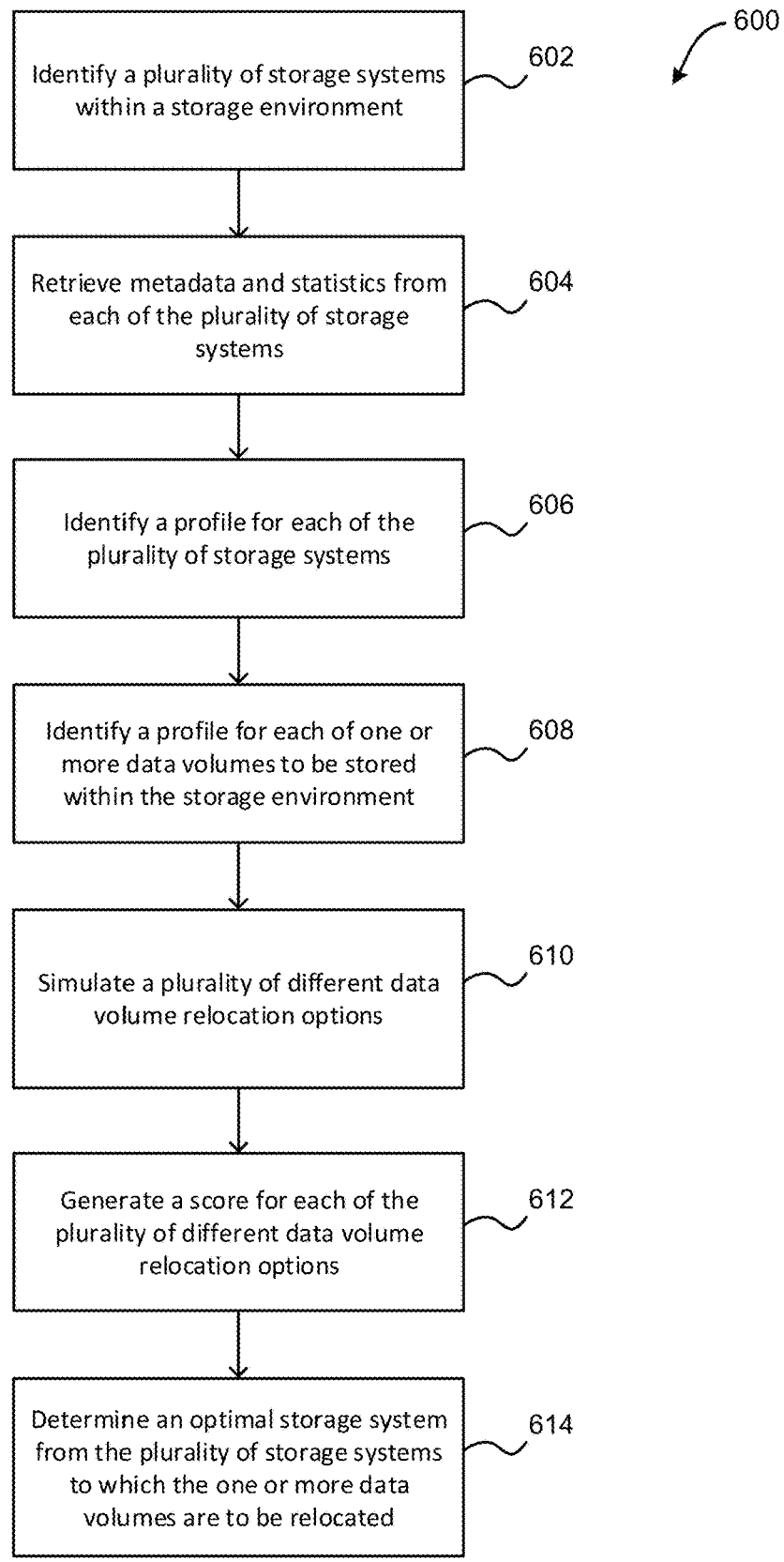
FIG. 6 illustrates a flowchart of a method for determining an optimal storage system for data volume relocation, in accordance with one embodiment.

Now referring to FIG. 6, a flowchart of a method 600 for determining an optimal storage system for data volume relocation is shown according to one embodiment. The method 600 may be performed in accordance with the present invention in any of the environments depicted in FIGS. 1-4 and 7, among others, in various embodiments. Of course, more or less operations than those specifically described in FIG. 6 may be included in method 600, as would be understood by one of skill in the art upon reading the present descriptions.

Each of the steps of the method 600 may be performed by any suitable component of the operating environment. For example, in various embodiments, the method 600 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6, method 600 may initiate with operation 602, where a plurality of storage systems are identified within a storage environment. Additionally, method 600 may proceed with operation 604, where metadata and statistics are retrieved from each of the plurality of storage systems. In one embodiment, for each of the plurality of storage systems, the metadata for the storage system may indicate one or more data reduction techniques implemented by the storage system. In another embodiment, for each of the plurality of storage systems, the statistics for the storage system may include historical performance statistics for the storage system.

Further, method 600 may proceed with operation 606, where a profile for each of the plurality of storage systems is identified. Further still, method 600 may proceed with operation 608, where a profile for each of one or more data volumes to be stored within the storage environment is identified. Also, method 600 may proceed with operation 610, where a plurality of different data volume relocation options are simulated. For example, the plurality of different data volume relocation options ma ybe simulated utilizing the metadata and statistics from each of the plurality of storage systems, the profile for each of the plurality of storage systems, and the profile for each of one or more data volumes to be stored within the storage environment.

In addition, method 600 may proceed with operation 612, where a score is generated for each of the plurality of different data volume relocation options. Furthermore, method 600 may proceed with operation 614, where an optimal storage system is determined from the plurality of storage systems, to which the one or more data volumes are to be relocated.

In one embodiment, a first data relocation option may include migrating the one or more data volumes to a first storage system, and a second data relocation option may include migrating the one or more data volumes to a second storage system. In another embodiment, the first storage system may implement a first type of data compression, and the second storage system may implement a second type of data compression different from the first type. In yet another embodiment, the first storage system and the second storage system may implement the same type of data compression, but a first set of additional data volumes may be currently stored within the first storage system, and but a second set of additional data volumes different from the first set of additional data volumes (e.g., having a different size and/or type, having different data, etc.) may be currently stored within the second storage system.

Further still, in one embodiment, a first simulation may simulate the first data relocation option, and a second simulation may simulate the second data relocation option. In another embodiment, the results of the first simulation may indicate a lower capacity usage that the results of the second simulation, with the same cost of data migration. In yet another embodiment, the score generated for the first simulation may be higher than the score for generated for the second simulation.

Also, in one embodiment, the first storage system may be determined as the optimal storage system for the one or more data volumes. In another embodiment, the one or more data volumes may be automatically migrated to the first storage system. In yet another embodiment, the first storage system and the second storage system may be displayed to a user in a list, where the first storage system is ranked higher than the second storage system. For example, the user may select a storage system to store the one or more data volumes, based on the list.

In this way, an optimal storage system for storing predetermined data volumes may be dynamically determined, and migration of the predetermined data volumes to the optimal storage system may be automatically implemented. This may maximize an effect of data reduction techniques implemented within a storage environment, and may minimize an amount of data stored within the storage environment. This may in turn reduce an amount of maintenance processing necessary for such stored data. By reducing an amount of necessary storage, as well as associated processing, the performance of storage systems within the storage environment may be improved.

Figure 7:
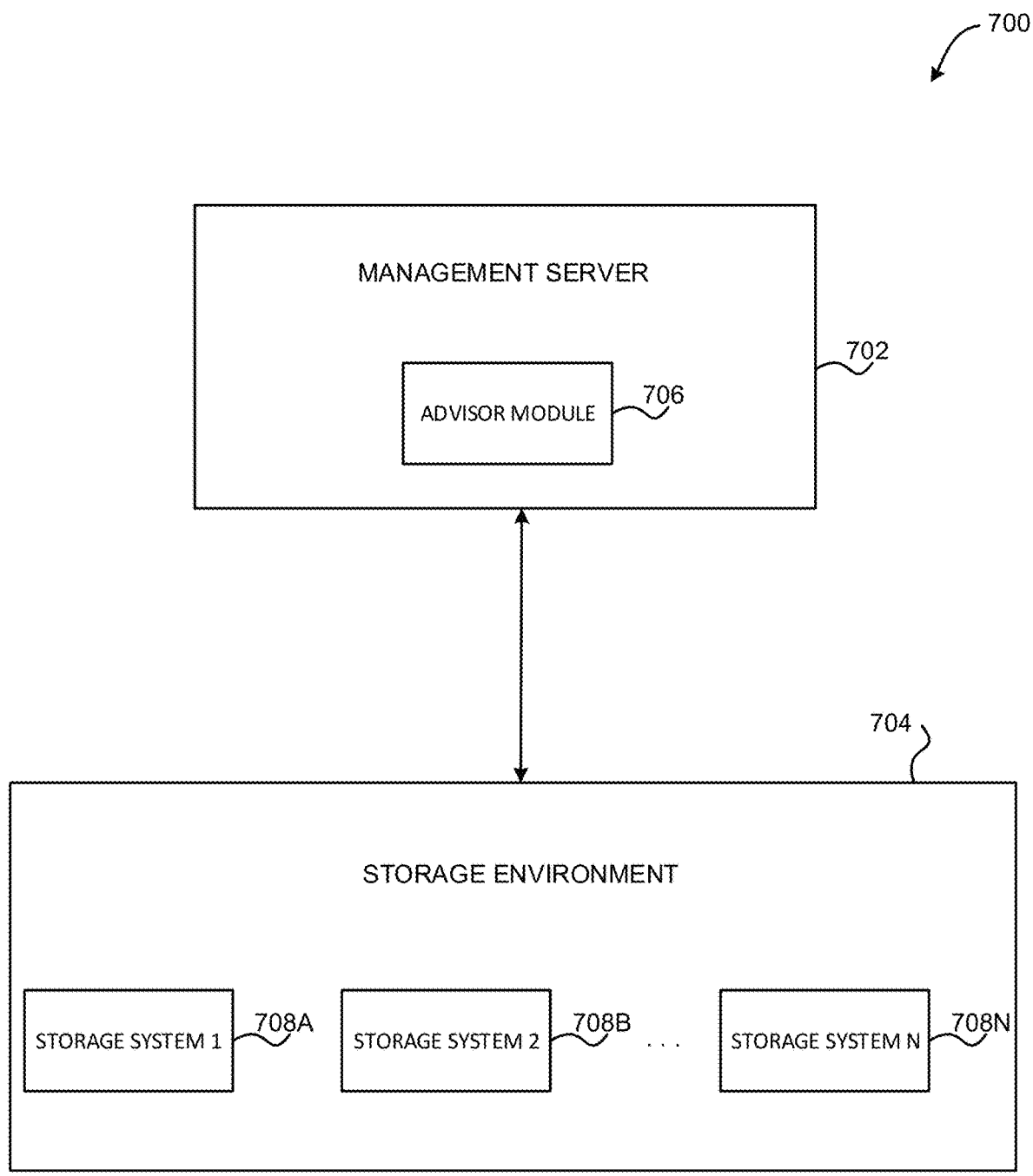
FIG. 7 illustrates an exemplary cognitive mixed storage provisioning environment, in accordance with one embodiment.

FIG. 7 illustrates an exemplary cognitive mixed storage provisioning environment 700, according to one embodiment. As shown, the environment 700 includes a management server 702 is in communication with a storage environment 704. The management server 702 includes an advisor module 706, and the storage environment 704 includes a plurality of different storage systems 708A-N.

In one embodiment, each of the plurality of different storage systems 708A-N may include a different type of storage. For example, the first storage system 708A may include software defined storage (SDS), the second storage system 708B may include disk-based storage (e.g., storage containing one or more hard disk drives, etc.), the Nth storage system 708N may include flash-based storage (e.g., storage containing one or more flash memory drives, etc.), etc.

Additionally, in one embodiment, one or more of the different storage systems 708A-N may include the same type of storage. In another embodiment, different sizes and types of data volumes may be currently stored on each of the plurality of different storage systems 708A-N. In yet another embodiment, two or more of the plurality of different storage systems 708A-N may store data volumes of the same size and/or type.

Further, in one embodiment, the advisor module 706 may run on the management server 702 external to the storage environment 704. All storage may be managed under one server/interface. The management server 702 may collect metadata and statistics from all storage systems 708A-N, including data at a volume granularity that includes IOPS and throughput statistics, cache hits and usage, I/O locality information, and content related data including data compressibility and information for understanding deduplication internally and with other volumes.

Further still, in one embodiment, an interface (e.g., a graphical user interface (GUI), etc.) may receive input from one or more users, and such input may be sent to the advisor module 706. The input may include a profile for one or more data volumes/domains/hosts/applications that includes:

A need for high/medium/low performance for the data
A need for high/medium/low capacity growth for the data
A need for high/medium/low minimization of costs for the data
A timeline and lifecycle for the data (e.g., the data is to be deleted in a predetermined number of months, etc.)
Required capabilities for the data (e.g., data mirroring, etc.)

Also, the input may include a profile for each of the storage systems 708A-N that includes:

A cost per unit of stored data within the storage
A maximum capacity in terms of storage, lOPS, throughput, etc.

Capabilities of the storage (e.g. whether/how the storage performs compression, deduplication, mirroring, etc.)

One or more planned data evacuations for the storage (e.g., evacuation is planned in a predetermined number of months, etc.)

In addition, the advisor module 706 may use all of the collected data to simulate a full system state for all possible data volume relocation options at the different storage systems 708A-N. This state may include the estimated capacity usage, total cost, and performance averages for each system as well as peaks and spikes. The estimates may be for both short term and for a long-term extrapolation.

Furthermore, the advisor module 706 may enumerate possible relocation options, and for each option, the advisor module 706 may generate a score that encompasses all of the key aspects (e.g., cost, performance, etc.). This score function may take into account the tradeoff between cost and performance and may be tailored for different customer preferences. The score may also take into account the cost of an associated data migration (this may change depending on the mechanism, e.g. to take into account migration that supports compression).

Further still, the advisor module 706 may then suggest to one or more users, via an interface (e.g., a notification, a message, a display, etc.), a destination for the one or more data volumes. The suggestions may depend on the policies defined by the user (e.g., needs, cost, evacuation, etc.). Several suggestions (that may be ranked by their scores) may be presented to the user, and the user may move between them and compare them with a financial report showing a current time period, a predicted future time period (e.g., 6 months from now (with a capacity growth analysis)), another predicted future time period (e.g., 12 months from now), etc.

Also, the user may be able, for each suggestion, to have an equalizer and to view/change the level of consideration for a plurality of metrics for each system or total to the suggestion plan (e.g., utilizing aggregation), where the metrics may include a financial metric, a performance metric, a capacity metric, etc. The user may be able to change the levels for each metric, and the scoring function will adjust and compute the relocation plan again, bringing new suggestions according to the new metric levels. The user may then be able to compare different plans in terms of financial, performance or capacity per moved volume and systems involved in the plan.

Additionally, for each suggested plan, the user may be able to see the improvement or decline in one or more aspects from the current situation, whether for the entire plan of every movement suggestion. The user may be able to mark each volume's movement suggestion in the GUI, even from multiple plans, and mix them into one custom plan, get its own equalizer and financial effect, and again compare with the suggestion plans.

Further, the user may be able to apply a plan (custom or suggestion) that may start a series of actions in the background, where the progress of the plan may be shown in a toolbar and dashboard. If a problem arises with the plan, the user may be notified to modify and continue the plan. The user may be able to apply only part of the plan as well.

In this way, storage of data volumes may be automatically optimized in terms of performance, storage size, and cost. For example, a user may receive a notification saying: "Save 10K$/year by moving a 2 Consistency Groups from a first storage system to a second storage system". The user may select the notification and may be directed to a screen showing the user the 10 volumes related to 2 CGs (graphically) from system A to system B (graphically), and showing a summary of the move:

CG1: We found 2 volumes in System B that can increase de-duplication ratio with the 8 volumes of CG1. You will save 8K$/year because of de-duplication ratio of 56% for CG1.

CG2: We found 1 volume in System B that can increase de-duplication ratio with the 2 volumes of CG2. You will save 2K$/year because of de-duplication ratio of 34% for CG2.

The user may right click on the CG2 graphical component and may choose: "Tune my rules" which may then will open a popup that may show a meter for: Latency, IOPS, Capacity, etc. A checkbox may also be shown for "never move it" and a checkbox may be shown to make mirroring required.

In response, the user may decrease the IOPS meter and may increase the capacity meter. The user may click OK. The window may recalculate and may showing now only CG1 (removing CG2 from the suggestion). The user may double click on the CG, seeing the 8 volumes, and the user may check 2 volumes, right click, and select "Tune my rules," which may open the same popup and now the user may click on "never move it" and may apply the changes.

The user may then ungroup the 2 volumes from the CG and may return to the suggestions window. The window may recalculate and may show now the 6 volumes with the message: "We found 2 volumes in System B that can increase de-duplication ratio with the chosen 6 volumes. You will save 6.5K$/year because of de-duplication ratio of 56%."

The user may select "apply" and may receive a message: "In order to move the volumes make sure you connect the 2 systems first." The user may move to a connectivity screen, may connect the volumes, and may then go back and select apply. OLVM may be started and may show a progress in the notifications area of the Ul.

The above use case may illustrate how a user may interact with various interfaces, and how the user may tune and mark objects in order to personalize them to their needs. By doing so, the advisor module 706 may learn the environment and may suggest (or automatically implement) any changes. In this way, the ability to dynamically find an optimal location for data volumes may be implemented by simulating a "what-if" scenario focusing on deduplication and compression actions.

After reviewing information associated with all data volumes from all the systems of any tier inside the storage environment 704, the advisor module 706 may calculating performance, storage, and monetary savings together with user-provided parameters of cost, performance, life cycle and importance, and the advisor module 706 may work as an agent listening and determining where to move data volumes every time new data volumes are introduced into the storage environment 704.

In this way, a centralized management tool may collect statistics and metadata from all storage systems in an environment regarding running volumes in the system, and may combine this with user specifications for various volumes. The management tool may then present recommendations for volume placement. The recommendations may take into account workload requirements (e.g., IOPS, latency, etc.), capacity savings (due to potential compression and deduplication) and storage properties of the underlying systems (including capabilities, potential IOPS and latency and an average storage cost of the specific storage system). The relocation suggestions may present the best relocation plans to fit a user's preferences. These preferences may be configured and tweaked via a management tool.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, comprising:
   identifying a plurality of storage systems within a storage environment, where each of the plurality of storage systems has a storage type that is different from other storage systems in the plurality of storage systems;
   determining characteristics of each of the plurality of storage systems, the characteristics including one or more data reduction techniques implemented by each of the plurality of storage systems;
   simulating a storage of one or more data volumes within each of the plurality of storage systems, utilizing the characteristics of each of the plurality of storage systems;
   assigning a score for each of the plurality of storage systems, based on the simulating; and
   selecting one of the plurality of storage systems to store the one or more data volumes, based on the score for each of the plurality of storage systems.

2. The computer-implemented method of claim 1, wherein a first storage system of the plurality of storage systems includes software-defined storage (SDS), a second storage system of the plurality of storage systems includes disk-based storage, and a third storage system of the plurality of storage systems includes flash-based storage.

3. The computer-implemented method of claim 1, wherein the one or more data reduction techniques include a type of data compression implemented by each of the plurality of storage systems.

4. The computer-implemented method of claim 1, wherein the one or more data reduction techniques include a type of data deduplication implemented by each of the plurality of storage systems.

5. The computer-implemented method of claim 1, wherein each of the plurality of storage systems has characteristics that are different from other storage systems in the plurality of storage systems.

6. The computer-implemented method of claim 1, wherein the one or more data reduction techniques implemented by a storage system of the plurality of storage systems is stored as metadata in association with the storage system.

7. The computer-implemented method of claim 1, wherein the characteristics also include historical performance statistics for each of the plurality of storage systems.

8. The computer-implemented method of claim 1, wherein the characteristics also include one or more profiles for each of the plurality of storage systems.

9. The computer-implemented method of claim 1, wherein the characteristics also include an amount and type of data currently being stored within each of the plurality of storage systems.

10. The computer-implemented method of claim 1, wherein simulating the storage of the one or more data volumes within each of the plurality of storage systems utilizes characteristics of each of the one or more data volumes to be stored, including, for each of the one or more data volumes:
    a performance requirement for the data volume,
    a capacity growth requirement for the data volume,
    a cost requirement for the data volume,
    a timeline and lifecycle for the data volume
    a compressibility of the data within the data volume, and
    deduplication-related characteristics of the data within the data volume.

11. The computer-implemented method of claim 1, wherein, for each of the plurality of storage systems, the characteristics of the storage system include:
    input/output measurements per second (IOPS),
    data throughput,
    cache hit percentage,
    cache usage,
    input/output (I/O) locality information,
    a cost associated with data volume storage within the storage system,
    a maximum storage capacity of the storage system,
    a maximum IOPS capacity of the storage system,
    data mirroring capabilities of the storage system,
    one or more planned data evacuations involving the storage system, and
    an amount and type of data currently being stored within the storage system.

12. The computer-implemented method of claim 1, wherein simulating the storage of the one or more data volumes within each of the plurality of storage systems considers additional data volumes already stored within the plurality of storage systems.

13. The computer-implemented method of claim 1, wherein the one or more data volumes are automatically transferred to the one of the plurality of storage systems determined to store the one or more data volumes.

14. The computer-implemented method of claim 1, wherein simulating the storage of the one or more data volumes within each of the plurality of storage systems resultsin a plurality of different factors, including, for each storage simulation:
    a capacity usage of a storage system selected to store the one or more data volumes in the storage simulation,
    an amount of data reduction performed by the storage system selected to store the one or more data volumes in the storage simulation,
    a total cost of using the storage system selected to store the one or more data volumes in the storage simulation, a performance of the storage system selected to store the one or more data volumes in the storage simulation, and a cost of a data migration to the storage system selected to store the one or more data volumes in the storage simulation.

15. The computer-implemented method of claim 14, further comprising weighting each of the plurality of different factors based on one or more predefined preferences.

16. The computer-implemented method of claim 15, wherein a storage system within the plurality of storage systems having a highest score is selected to store the one or more data volumes.

17. A computer program product for distributing data across a mixed data storage center, the computer program product comprising a computer readable storage medium having program instructions embodied therewith, wherein the computer readable storage medium is not a transitory signal per se, the program instructions executable by a processor to cause the processor to perform a method comprising:
- identifying a plurality of storage systems within a storage environment, utilizing the processor, where each of the plurality of storage systems has a storage type that is different from other storage systems in the plurality of storage systems;
- determining characteristics of each of the plurality of storage systems, utilizing the processor, the characteristics including one or more data reduction techniques implemented by each of the plurality of storage systems;
- simulating, utilizing the processor, a storage of one or more data volumes within each of the plurality of storage systems, utilizing the characteristics of each of the plurality of storage systems;
- assigning, utilizing the processor, a score for each of the plurality of storage systems, based on the simulating;

and selecting, utilizing the processor, one of the plurality of storage systems to store the one or more data volumes, based on the score for each of the plurality of storage systems.

18. The computer program product of claim 17, wherein the one or more data reduction techniques include a type of data compression implemented by each of the plurality of storage systems.

19. The computer program product of claim 17, wherein the one or more data reduction techniques include a type of data deduplication implemented by each of the plurality of storage systems.

20. A system, comprising:
- a processor; and
- logic integrated with the processor, executable by the processor, or integrated with and executable by the processor, the logic being configured to:
- identify a plurality of storage systems within a storage environment, where each of the plurality of storage systems has a storage type that is different from other storage systems in the plurality of storage systems;
- determine characteristics of each of the plurality of storage systems, the characteristics including one or more data reduction techniques implemented by each of the plurality of storage systems;
- simulate a storage of one or more data volumes within each of the plurality of storage systems, utilizing the characteristics of each of the plurality of storage systems;
- assign a score for each of the plurality of storage systems, based on the simulating; and
- select one of the plurality of storage systems to store the one or more data volumes, based on the score for each of the plurality of storage systems.

* * * * *